United States Patent
Hetzler

(10) Patent No.: US 10,748,680 B2
(45) Date of Patent: Aug. 18, 2020

(54) RESISTOR AND METHOD FOR THE PRODUCTION THEREOF

(71) Applicant: Isabellenhütte Heusler GmbH & Co. KG, Dillenburg (DE)

(72) Inventor: Ullrich Hetzler, Dillenburg-Oberscheld (DE)

(73) Assignee: ISABELLENHÜTTE HEUSLER GMBH & CO. KG, Dillenburg (DE)

( * ) Notice: Subject to any disclaimer, the term of this patent is extended or adjusted under 35 U.S.C. 154(b) by 0 days.

(21) Appl. No.: 16/312,422

(22) PCT Filed: Jul. 3, 2017

(86) PCT No.: PCT/EP2017/066507
§ 371 (c)(1),
(2) Date: Dec. 21, 2018

(87) PCT Pub. No.: WO2018/010996
PCT Pub. Date: Jan. 18, 2018

(65) Prior Publication Data
US 2019/0237226 A1    Aug. 1, 2019

(30) Foreign Application Priority Data
Jul. 11, 2016 (DE) .................. 10 2016 008 415

(51) Int. Cl.
*H01C 7/06* (2006.01)
*G01R 1/20* (2006.01)
(Continued)

(52) U.S. Cl.
CPC ............. *H01C 7/06* (2013.01); *G01R 1/203* (2013.01); *G01R 19/32* (2013.01); *H01C 1/14* (2013.01);
(Continued)

(58) Field of Classification Search
CPC .......... H01C 7/06; H01C 1/14; H01C 17/232; H01C 17/242; G01R 1/203; G01R 19/32
See application file for complete search history.

(56) References Cited

U.S. PATENT DOCUMENTS

| | | | |
|---|---|---|---|
| 1,407,147 A | 2/1922 | Goodwin, Jr. | |
| 4,906,968 A * | 3/1990 | Gershenfeld | H01C 7/041 338/25 |

(Continued)

FOREIGN PATENT DOCUMENTS

| | | |
|---|---|---|
| DE | 202010005756 U1 | 9/2010 |
| DE | 102010009835 A1 | 9/2011 |

(Continued)

OTHER PUBLICATIONS

FR 2884615, Torcheux et al. Machine translation. (Year: 2006).*
(Continued)

*Primary Examiner* — Kyung S Lee
(74) *Attorney, Agent, or Firm* — Klintworth & Rozenblat IP LLP

(57) ABSTRACT

The invention concerns a resistor, in particular a low-resistance current measuring resistor, having two connecting parts made of a conductor material and a resistor element made of a resistance material inserted between the connecting parts, the resistance material having a specific thermal force which generates a specific thermoelectric voltage in the event of a temperature difference between the resistor element on the one hand and the connecting parts on the other hand. The invention additionally provides for a compensating element which in operation generates a thermoelectric voltage which at least partially compensates for the thermoelectric voltage generated by the resistor element. Furthermore, the invention includes a corresponding manufacturing process.

21 Claims, 4 Drawing Sheets

Figure 1:
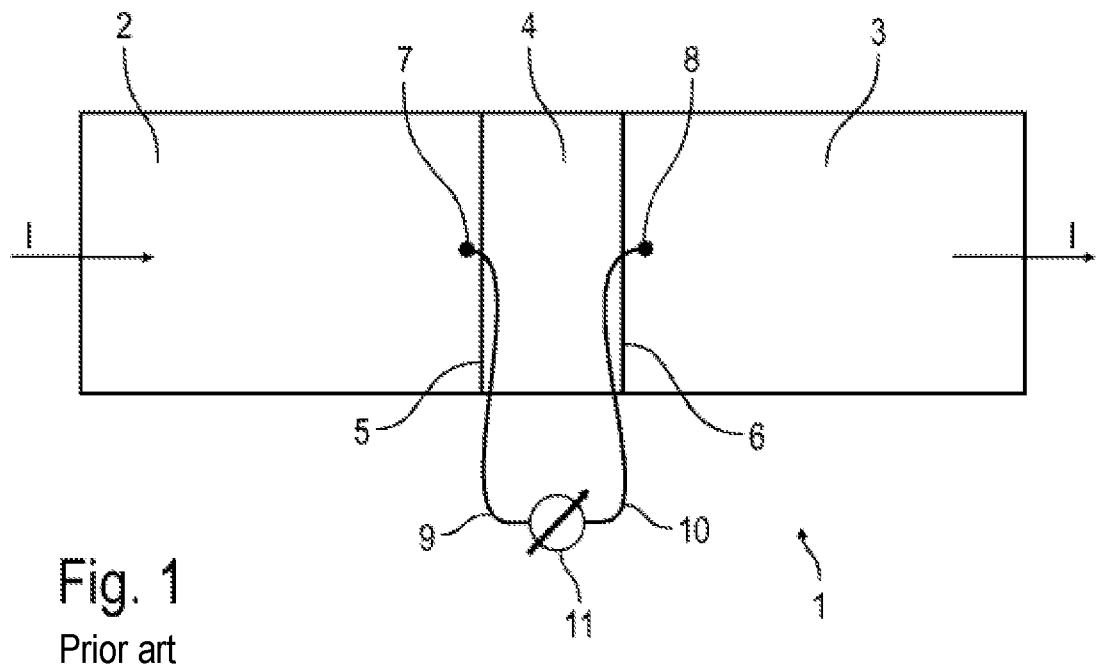

(51) Int. Cl.
*H01C 17/24* (2006.01)
*H01C 17/242* (2006.01)
*G01R 19/32* (2006.01)
*H01C 17/232* (2006.01)
*H01C 1/14* (2006.01)
*H05K 1/18* (2006.01)
*H05K 3/34* (2006.01)

(52) U.S. Cl.
CPC ........ *H01C 17/232* (2013.01); *H01C 17/24* (2013.01); *H01C 17/242* (2013.01); *H05K 1/181* (2013.01); *H05K 3/341* (2013.01); *H05K 2201/10022* (2013.01)

(56) References Cited

U.S. PATENT DOCUMENTS

| | | | |
|---|---|---|---|
| 5,083,081 A | 1/1992 | Barrault et al. | |
| 6,489,693 B1* | 12/2002 | Hetzler | G01R 19/0092 307/10.1 |
| 9,237,653 B2* | 1/2016 | Kondou | H05K 1/0296 |
| 9,377,491 B2* | 6/2016 | Sato | G01R 1/203 |
| 10,438,730 B2* | 10/2019 | Kao | H01C 1/14 |
| 2010/0201369 A1* | 8/2010 | Gronwald | H01C 1/14 324/430 |
| 2012/0154104 A1* | 6/2012 | Hetzler | H01C 17/28 338/49 |
| 2015/0041200 A1* | 2/2015 | Hetzler | H05K 1/181 174/260 |

FOREIGN PATENT DOCUMENTS

| | | |
|---|---|---|
| DE | 102013005939 A1 | 10/2014 |
| EP | 0605800 A1 | 12/1993 |
| FR | 2568684 A1 | 2/1986 |
| FR | 2659177 A1 | 9/1991 |
| FR | 2884615 A1 | 10/2006 |

OTHER PUBLICATIONS

International Search Report and Written Opinion for corresponding International Patent Application No. PCT/EP2017/066507 dated Oct. 19, 2017, 14 pages.
Abstract for DE102010009835A1.
Abstract for DE102013005939A1.
Machine translation for DE202010005756U1.
Abstract for EP0605800A1.
Machine translation for FR2568684A1.
Machine translation for FR2884615A1.

* cited by examiner

RESISTOR AND METHOD FOR THE PRODUCTION THEREOF

CROSS-REFERENCE TO RELATED APPLICATIONS

This patent application is a US Section 371 national stage application based on International Patent Application No. PCT/EP2017/066507, filed Jul. 3, 2017, entitled "Resistor and Method for the Production Thereof," which claims priority from German application No. DE 10 2016 008 415.4 dated Jul. 11, 2016, the content of which is incorporated by reference in its entirety.

The invention concerns a resistor, in particular a low-resistance current measuring resistor, and a method of manufacturing such a resistor.

Low-resistance resistors with resistance values ranging from a few µOhm to some 100 µOhm are increasingly used for high-precision measurement of high DC and AC currents from 100 A up to 20 kA. However, the measured voltages are very low in the mV range, so that voltages in the µV range must be measured at the required resolutions of 16 bits or 0.01%. However, this means that false voltages, e.g. caused by thermoelectric effects or induction, can already cause considerable errors. This is particularly true if a small proportion of direct current must be detected in alternating currents. In this case, the measuring system must be absolutely offset-free and at the same time the extremely disturbing thermoelectric voltages must be avoided. These voltages occur when two different conductive materials come into contact when a temperature gradient is simultaneously present in the contact point. In measurement technology, attempts are made to avoid these errors by avoiding temperature gradients as far as possible, connecting only similar materials or, if unavoidable, thermo-electrically matching different materials to each other by suitable alloy optimization. In the case of resistors, this means that the resistance material used should be thermoelectrically optimally matched to the copper. This requirement is met to a high degree for the well-known precision resistor alloys Manganin®, Zeranin® and Isaohm®. Nevertheless, the errors caused by the residual thermoelectric voltages are clearly visible in today's measurement possibilities and ultimately limit the resolution and quality of the measurement. By measuring the temperature difference over the resistance and a calibration measurement, a rough elimination of this error is possible. Since, however, the thermal force of the resistance materials used generally depends strongly on the temperature, this procedure is complex and limited in accuracy.

The technical background of the invention can also be found in FR 2 884 615 A1, FR 2 659 177 A1 and DE 10 2010 009 835 A1.

The invention is therefore based on the task of minimizing the measurement errors generated by thermoelectric voltages in a resistor (e.g. low resistance current measuring resistor).

This task is solved by a resistor according to the invention or a manufacturing method according to the invention as defined in the independent claims.

The invention comprises the general technical teaching of compensating the interfering thermoelectric voltage generated by the resistor element by an oppositely directed thermoelectric voltage generated by a compensating element connected in parallel.

In accordance with the state of the art, the invention-based resistor initially has a first connecting part made of a conductor material (e.g. copper, copper alloy), whereby the first connecting part is preferably used to introduce an electrical current to be measured into the resistor.

Furthermore, in accordance with the state of the art, the inventive resistor has a second connecting part made of the conductor material (e.g. copper, copper alloy), the second connecting part preferably serving to conduct the electrical current to be measured out of the resistor.

Furthermore, the invention-based resistor comprises a resistor element made of a resistance material (e.g. Manganin®), wherein the resistor element is arranged in the current direction between the first connecting part and the second connecting part and the electrical current to be measured flows through it.

The resistance material of the resistive element has a certain thermal force which, if there is a temperature difference between the resistor element on the one hand and the adjoining connecting parts on the other hand, generates a certain thermoelectric voltage which leads to a measurement error without compensation, as already explained at the beginning of this article.

The resistor according to the invention therefore has an additional compensating element which generates a thermoelectric voltage during operation which at least partially compensates the thermoelectric voltage generated by the resistor element.

In a preferred example of the invention, the resistor has two voltage taps which are electrically conductively connected to the first and second connecting part, respectively and, according to the well-known four-wire technology, enable the electrical voltage falling across the resistor element to be measured. For this purpose, a voltage measuring circuit with a voltage meter can be connected to the two voltage taps.

In the simplest case, the two voltage taps consist of a surface section on the surface of the two connecting parts in order to be able to contact a voltage measuring line. Alternatively, it is also possible that the two voltage taps consist of lateral projections formed on the connecting parts. The invention is therefore not limited to certain specific designs with regard to the design of the voltage taps.

It should also be mentioned that the resistor preferably has two current connections in order to lead the current into the resistor and to lead it out of the resistor respectively. These current connections are then located at the two connecting parts. For example, cables or busbars can be soldered or welded on or mounted using a screw connection. These current connections can, for example, consist of a hole in the connecting parts. A power contact screw can then be screwed into this hole. Alternatively, there is the possibility that the current connections each have a screw, which is molded onto the connecting parts. Such current connections are known from the state of the art (e.g. EP 0 605 800 A1) and therefore do not have to be described in detail.

In the preferred embodiment of the invention, the compensating element is thermally connected in parallel with the resistor element, so that the compensating element is exposed to essentially the same temperature differences as the resistor element and therefore generates essentially the same thermoelectric voltage in terms of amount as the resistor element.

The compensating element is preferably connected in series with the resistor element in the voltage measuring circuit, so that the thermoelectric voltages of the resistor element on the one hand and of the compensating element on the other hand at least partially compensate each other.

In an embodiment of the invention, the second voltage tap used for potential measurement at the second connecting part is not arranged at the second connecting part, but at the first connecting part. The second voltage tap is preferably electrically isolated from the first connecting part. The compensating element is preferably thermally conductively connected to the first connecting part at the second voltage tap. The second voltage tap is then electrically conductively connected via the compensating element to a contact point on the second connecting part. In addition, the compensating element is electrically and thermally conductively connected to the second connecting part at the contact point on the second connecting part. This ensures that the compensating element is thermally connected parallel to the resistor element and in series with the resistor element in the voltage measuring circuit. As a result, the thermoelectric voltages of the resistor element on the one hand and of the compensating element on the other hand at least partially compensate each other.

In a variant of the invention, the compensating element is a wire, which preferably also consists of the resistance material (e.g. Manganin®) of the resistor element. However, this invention variant with a wire as the starting element is not yet optimal due to batch fluctuations and the influence of the weld seam, possible changes in the thermoelectric voltage during forming and annealing processes and logistical problems. In addition, the wire would have to be assembled by hand, which could be too costly for mass production. Irrespective of this, manual assembly is not without its problems, as the wire should be quite thin and wetting the resistance material (e.g. Manganin®) with the solder during soldering could change the thermoelectric voltage.

In another variant of the invention it is therefore provided that the compensating element is a composite material plate of the same batch, which consists of the conductor material (e.g. copper, copper alloy) of the connecting parts on the outside and the resistance material (e.g. Manganin®) of the resistor element in the middle. This avoids the problems described above with a compensating element in the form of a wire.

In another variant of the invention, the compensating element is separated from the finished resistor. This means that the compensating element comprises a part of the resistor element which is then electrically insulated from the rest of the resistor element. The compensating element may also include a part of the first connecting part which is then electrically isolated from the rest of the first connecting part.

For example, a slit can be introduced into the resistor, whereby the slit separates the compensating element from the rest of the resistor element or the first connecting part.

This slit can be introduced into the resistor by a laser beam, a water jet or by milling.

The slit in the finished resistor is preferably filled with a filling material that is electrically insulating and thermally conductive.

In the case of a compensating element machined from the resistor element, the compensating element preferably has a reduced thickness, which is reduced compared to the rest of the resistor. The thickness of the compensating element can then, for example, be less than 50%, 30%, 20%, 10% or even 5% of the thickness of the rest of the resistor. This thickness reduction can be achieved, for example, by milling off the resistor in the area of the compensating element.

It should also be mentioned that the invention may result in over-compensation of the thermoelectric voltages. To avoid such overcompensation, a voltage divider with two resistors is provided in a variant of the invention. The voltage divider is then connected in parallel to the compensating element and has a center tap which forms an external voltage tap for a voltmeter.

In an embodiment of the invention, a special printed circuit board is provided which carries a Manganin® foil on one side instead of a copper foil, for example, as a compensating element. In this case, the structure of the compensating element can be produced with high reproducibility by etching, as is customary in PCB technology. In this example, the printed circuit board also carries the compensating element. It should also be mentioned that the printed circuit board is preferably multilayer and preferably soldered to the resistor.

The compensating element is preferably located on the top side facing away from the resistor or on an inner layer of the printed circuit board. The printed circuit board then preferably has a first electrical through-connection which establishes both an electrical and a thermally (first thermal coupling) conductive connection with the first connecting part of the resistor and is electrically conductively connected to the first voltage tap. In addition, the printed circuit board has a second thermal coupling that thermally connects the compensating element to the second connecting part. The two thermal couplings ensure that the compensating element is thermally connected in parallel to the resistor element and is therefore exposed to the same temperature differences.

A voltage divider can also be provided for this variant of the invention with a printed circuit board in order to avoid the disturbing over-compensation already mentioned above, whereby this voltage divider can be arranged on the printed circuit board.

Preferably, the compensating element consists of a material which has essentially the same thermal force as the resistance material, in particular with a deviation of less than ±10%, ±5%, ±2% or even less than ±1%.

It is therefore advantageous if the compensating element also consists of the resistance material of the resistor element. In order to avoid manufacturing variations in the thermal force of the resistance material, it is also advantageous if the compensating element and the resistor element are manufactured from the same batch of the resistance material.

It should also be mentioned that the connecting parts and/or the resistor element are preferably plate-shaped, as is known from EP 0 605 800 A1, for example. In this context it should be mentioned that the connecting parts and the resistor element can be either flat or curved.

It has already been mentioned above that the conductor material of the connecting parts is preferably copper or a copper alloy. Alternatively, it is also possible, for example, that the conductor material is aluminum. In this context it should also be mentioned that it is not absolutely necessary that the two connecting parts consist of the same conductor material. The only decisive factor is that the conductor material has an extremely low specific electrical resistance.

It has also been briefly mentioned above that the resistance material of the resistor element may be Manganin®. This is the copper-manganese-nickel alloy Cu86Mn12Ni2. Alternatively, it is also possible that the resistance material of the resistor element is a different copper-manganese-nickel alloy or a nickel-chromium alloy, to name just a few examples.

The only decisive factor is that the resistance material of the resistor element preferably has a higher specific electrical resistance than the conductor material of the connecting parts, which is important for a four-wire measurement.

For example, the resistivity of the resistance material can range from $1 \cdot 10^{-8}$ Ωm to $50 \cdot 10^{-7}$ Ωm The resistance value of the total resistor, on the other hand, is preferably in the range from 0.1 μΩ to 3000 μΩ.

It should also be mentioned that the resistor according to the invention preferably has a resistance value with a very low temperature coefficient which is preferably less than 500 ppm/K.

It should also be noted that the two connecting parts and the resistor element can be separated from a composite material strip transversely to the longitudinal direction of the composite material strip and optionally bent. This is well known from EP 0 605 800 A1, for example, and therefore does not need to be described in detail.

Finally, the invention also includes a corresponding manufacturing process, whereby the process steps already result from the above description of the resistor according to the invention and therefore do not have to be described separately.

Figure 2:
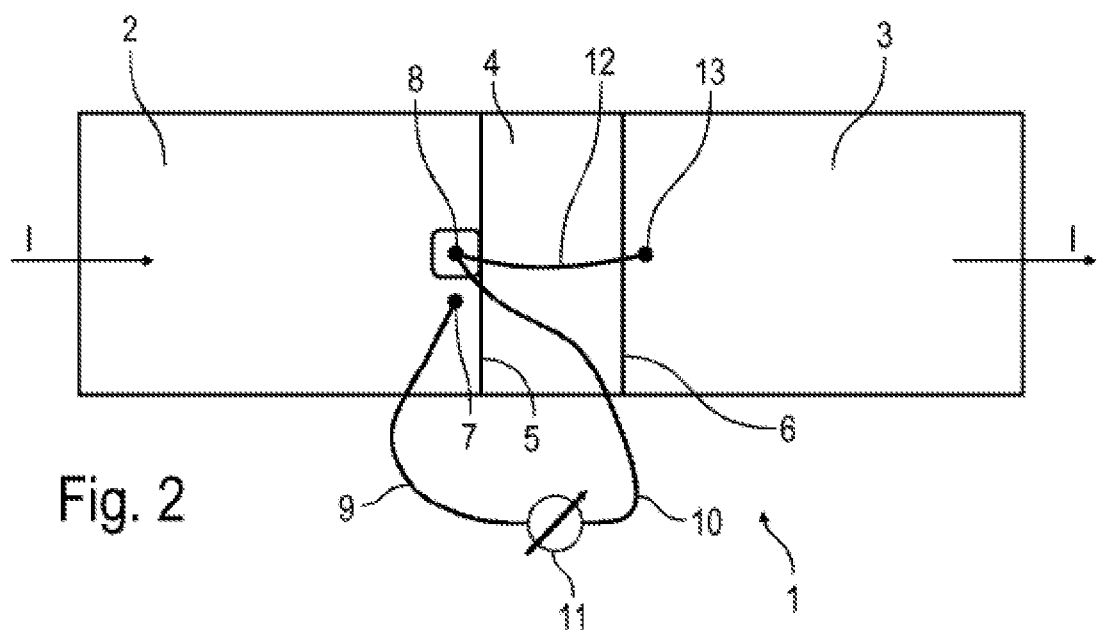
Figure 3:
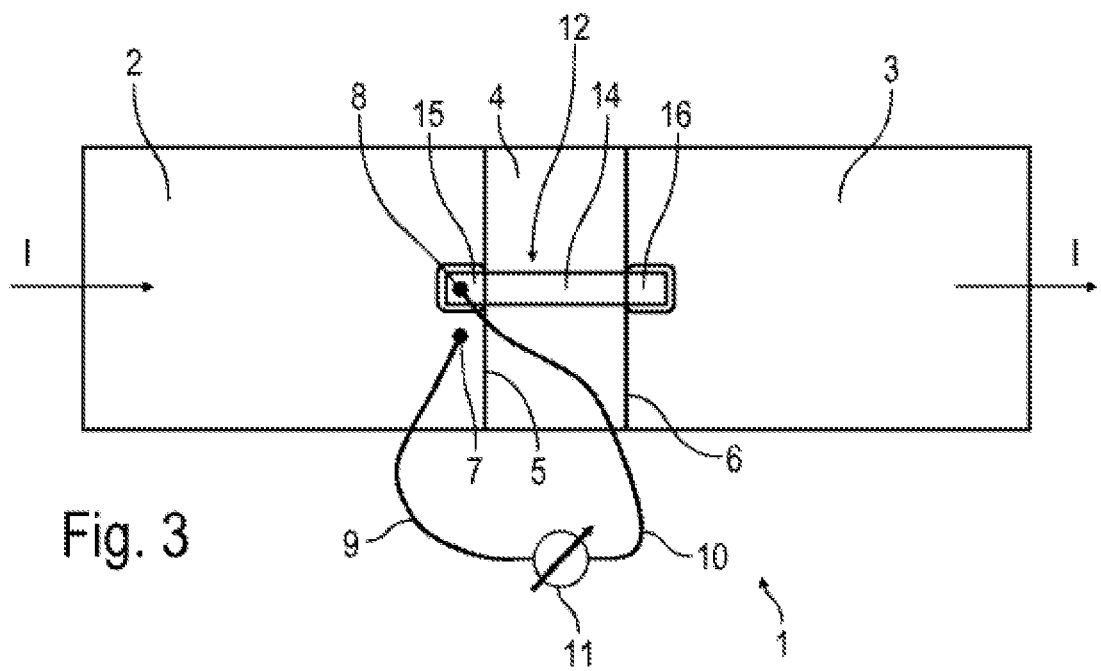
Figure 4:
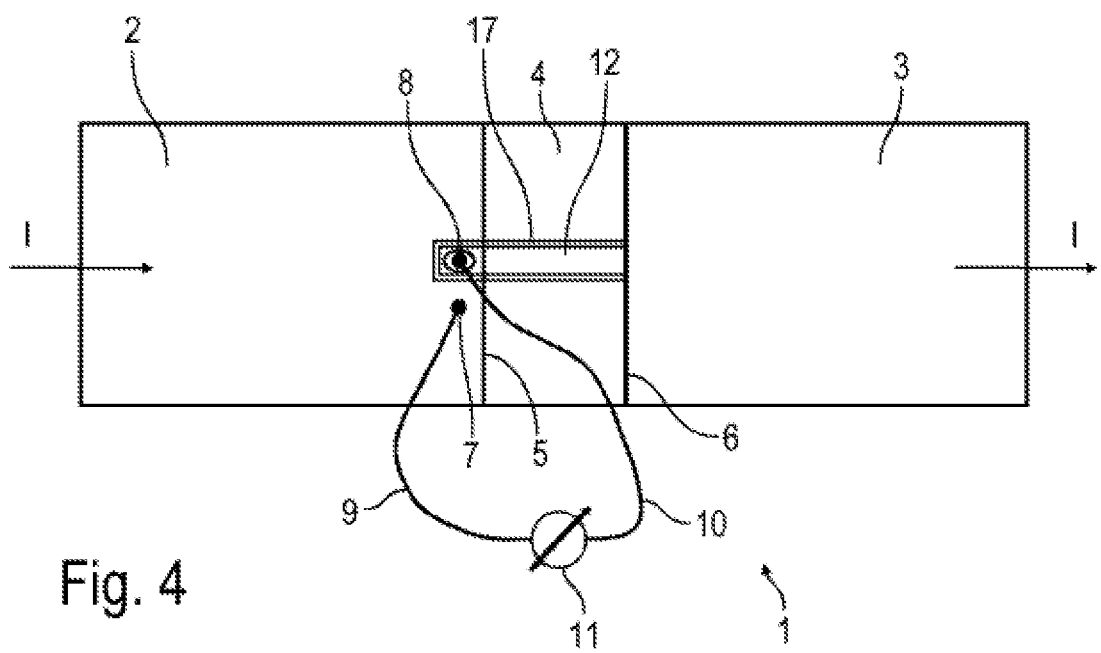
Figure 5:
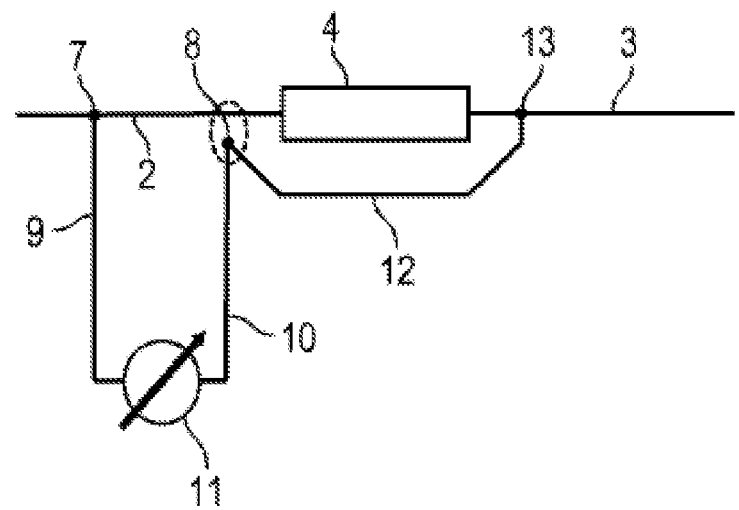
Figure 6:
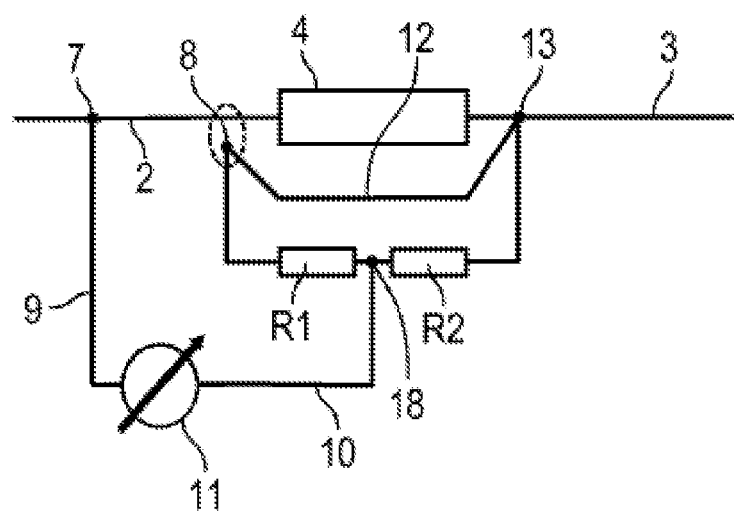
Figure 7A:
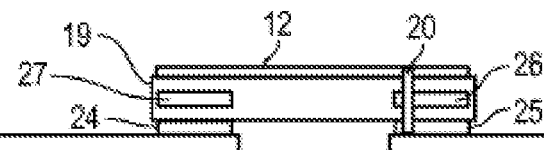
Figure 7B:
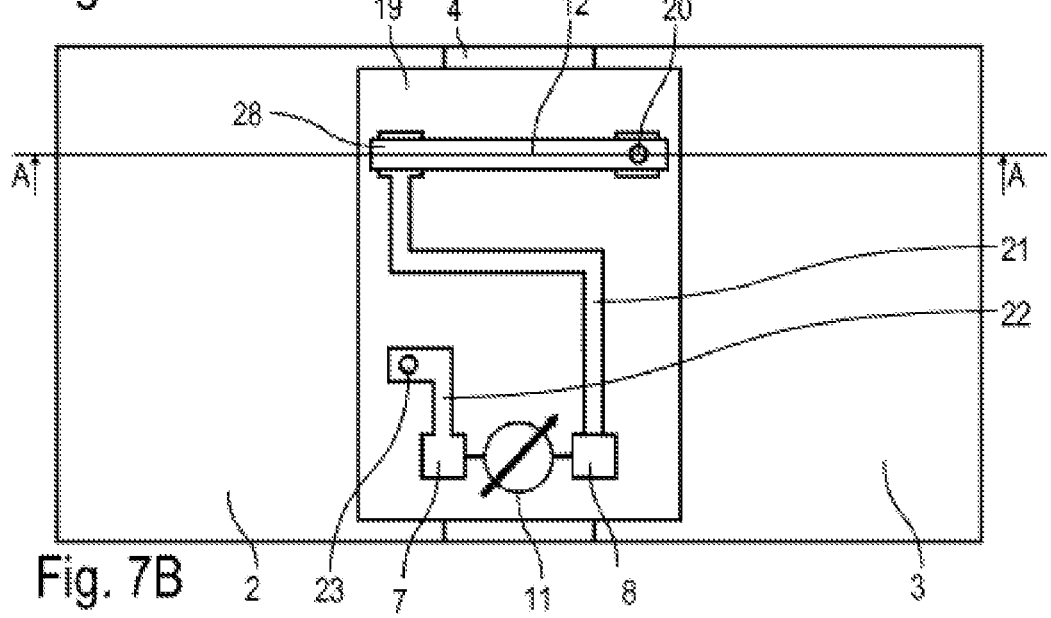
Figure 8:
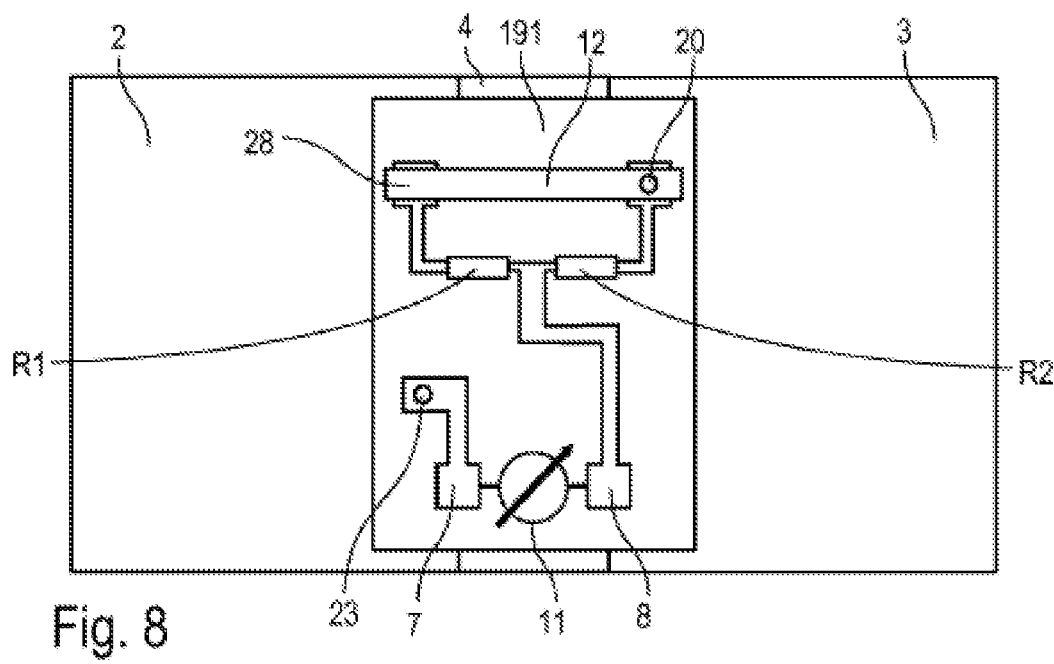

Other advantageous further modifications of the invention are indicated in the dependent claims or explained in more detail below together with the description of the preferred embodiments of the invention using the figures. The show:

FIG. 1 shows a schematic representation of a conventional low-resistance current measuring resistor for current measurement according to the four-wire technique, FIG. 2 an inventive modification of a low resistance current measuring resistor with a compensating element in the form of a wire or ribbon, FIG. 3 a modification of FIG. 2, where instead of the wire or ribbon a composite material plate is used as a compensating element, FIG. 4 is a modification of FIG. 2, where the compensating element is machined out of the finished resistor, FIG. 5 shows a schematic diagram illustrating the principle of the compensating element, FIG. 6 shows a modification of FIG. 5 with an additional voltage divider to avoid overcompensation of the thermoelectric voltages, FIG. 7A shows a cross-sectional view through an resistor according to the invention with a printed circuit board carrying the compensating element along the section line A-A in FIG. 7B, FIG. 7B a top view of the embodiment according to FIG. 7A, and FIG. 8 is a modification of FIG. 7B.

FIG. 1 shows a schematic representation of a conventional low resistance current measuring resistor 1, as known from EP 0 605 800 A1.

The current measuring resistor 1 first has a first plate-shaped connecting part 2 made of a conductor material (e.g. copper, copper alloy) in order to introduce an electrical current I to be measured into the current measuring resistor 1.

In addition, the current resistor 1 has a plate-shaped second connecting part 3, which also consists of a conductor material (e.g. copper, copper alloy) and serves to conduct the electrical current I to be measured out of the current resistor 1.

A plate-shaped resistor element 4 is also inserted between the two connecting parts 2, 3, which is electrically and mechanically connected to the two adjacent connecting parts 2, 3 by means of weld seams 5, 6. The electrical current I to be measured is therefore fed into the current measuring resistor 1 via the connecting part 2, then flows through resistor element 4 and is finally led out of the current measuring resistor 1 again via the connecting part 3.

A voltage drops over the resistor element 4 during operation, which is proportional to the electrical current I to be measured according to Ohm's law, allowing current measurement according to the well-known four-wire technique.

For this reason, two voltage taps 7, 8 are located on the two connecting parts 2, 3 in the immediate vicinity of the resistor element 4, each of which is connected to a voltage measuring instrument 11 via a voltage measuring line 9, 10. The electrical voltage measured by the voltage measuring instrument 11 is then a direct measure of the electrical current I flowing through the current measuring resistor in accordance with Ohm's law.

As already mentioned at the beginning, the problem here is that the conductor material of the connecting parts 2, 3 generally has a slightly different thermal force than the resistance material of resistor element 4. As a result, temperature differences between the resistor element 4 on the one hand and the connecting parts 2, 3 on the other hand result in thermoelectric voltages which falsify the voltage measurement by the voltage measuring instrument 11.

This problem is solved by the embodiment according to the invention shown in FIG. 2, which is described below. However, the example shown in FIG. 2 partially corresponds to the conventional current resistor 1 shown in FIG. 1, so that, in order to avoid repetitions, reference is made to the above description, using the same reference signs for corresponding details.

A special feature of this embodiment is that the second voltage tap 8 for the potential measurement on the second connecting part 3 is not located on the second connecting part 3, but on the first connecting part 2, close to the weld seam 5. However, the second voltage tap 8 is electrically isolated from the first connecting part 2, for example by an electrically isolated, thermally coupled solder joint.

The electrical connection between the second voltage tap 8 and the second connecting part 3 is made by a compensating element 12 in the form of a wire or ribbon. The compensating element 12 is electrically connected at one end to the second voltage tap 8. At its opposite end, the wire- or ribbon-shaped compensating element 12 is electrically and thermally connected to a contact point 13 on the second connecting part 3.

As a result of this arrangement, the filamentary compensation element 12 is thermally connected in parallel with the resistor element 4 and is therefore exposed to the same temperature differences as the resistor element 4 during operation. As a result, the filamentary compensating element 12 also generates the same thermoelectric voltage as the resistor element 4, as the resistor element 4 is made of the same resistance material as the filamentary compensating element 12. Thermal contacting is effected, on the one hand, by the second voltage tap 8 and, on the other hand, by the contact point 13.

On the other hand, this design means that the compensating element 12 in the voltage measuring circuit is connected in series with the resistor element 4, so that the thermoelectric voltages of the resistor element on the one hand and of the compensating element 12 on the other hand compensate each other.

FIG. 3 shows a modification of the embodiment according to FIG. 2, so that in order to avoid repetitions, reference is made to the above description, using the same reference signs for corresponding details.

A special feature of this example is that the compensating element 12 is not formed by a wire or a ribbon, but by a composite material plate with a central part 14 of the same resistance material as the resistor element 4 and two outer parts 15, 16 of the same conductor material as the two connecting parts 2, 3.

Otherwise, the operation of this example corresponds to that of the example shown in FIG. 2, so to avoid repetition, please refer to the above description.

FIG. 4 shows a modification of the embodiments according to FIGS. 2 and 3, so that to avoid repetitions, reference is made again to the above description, using the same reference signs for corresponding details.

A special feature of this example is that the compensating element 12 is not subsequently connected to the current measuring resistor 1. Instead, the compensating element 12 is machined out of the finished current resistor 1. For this purpose, a slit 17 is inserted into the current measuring resistor 1, for example by means of a laser beam, a water jet or by milling. The slit 17 separates the compensating element 12 from the rest of the resistor element 4. In addition, the slit 17 also separates the compensating element 12 from the rest of the connecting part 2. The slit 17 thus also surrounds the second voltage tap 8 in the area of the first connecting part 2.

The operation of this example corresponds to the operation of the other examples of the invention described above, so that reference can be made to the above description to avoid repetition.

FIG. 5 shows a schematic equivalent circuit diagram of the embodiments according to FIGS. 2-4.

It should be noted that over-compensation of the thermoelectric voltage may occur under certain circumstances. In order to avoid such overcompensation, the embodiment in FIG. 6 shows that a voltage divider consisting of two resistors R1, R2 is connected in parallel to the compensating element 12, the voltage divider consisting of the resistors R1, R2 having a center tap 18 connected to the voltage measuring instrument 11.

FIGS. 7A and 7B show another embodiment of a current measuring resistor 1 according to the invention. This embodiment also partly corresponds to the embodiments described above, so that reference is made to the above description in order to avoid repetitions, using the same reference signs for corresponding details.

A special feature of this embodiment is that the compensating element 12 is realized as a foil which is arranged on a printed circuit board 19 on the upper side or one of the inner layers of the printed circuit board 19. The printed circuit board 19 is here arranged on the upper side of the current measuring circuit 1 and thermally and electrically connected to the current measuring resistor 1 (preferably soldered, soldering joints 24, 25), as explained below.

Thus the printed circuit board 19 has an electrical through-contact 20, which electrically and thermally connects the compensating element 12 with the second connecting part 3.

On the opposite end, the compensating element 12 is connected to a copper track 21, which electrically conductively connects the compensating element 12 to the second voltage tap 8.

The first voltage tap 7, on the other hand, is connected via a further copper track 22 to an electrical through-contact 23, which makes an electrical contact with the first connecting part 2. This design ensures that the compensating element 12 is thermally connected in parallel with the resistor element 4, while the compensating element 12 in the voltage measuring circuit is connected in series with the resistor element 4, so that the thermoelectric voltages of the resistor element on the one hand and of the compensating element 12 on the other compensate each other.

It should be mentioned here that thermal couplings 26, 27, consisting of suitably shaped Cu inner layers, are also provided, which thermally connect the ends of the compensating element 12 better with the connecting part 2 or the connecting part 3.

FIG. 8 shows a modification of FIG. 7B with the voltage divider from resistors R1 and R2 already shown in FIG. 6. With regard to the functioning of this variation, reference can therefore be made to the above description of FIG. 6.

The invention is not limited to the preferred embodiments described above. Rather, a large number of variants and modifications are possible which also make use of the invention idea and therefore fall within the scope of protection. In particular, the invention also claims protection for the subject matter and the features of the dependent claims independently of the claims referred to in each case and also without the features of the main claim.

LIST OF REFERENCE SIGNS

1 Current measuring resistor
2 First connecting part
3 Second connecting part
4 Resistor element
5 Weld seam
6 Weld seam
7 First voltage tap
8 Second voltage tap
9 Voltage measuring line
10 Voltage measuring line
11 Voltage measuring instrument
12 Compensating element
13 Contact point of the compensating element on the second connecting part
14 Middle part of the compensating element
15 Outdoor part of the compensating element
16 Outdoor part of the compensating element
17 Slit
18 Center tap of the voltage divider
19 Printed circuit board
20 Electrical through-connection
21 Copper track
22 Copper track
23 Electrical through-connection
24 Solder joint
25 Solder joint
26 Cu inner layer for better thermal coupling
27 Cu inner layer for better thermal coupling
28 Contact point
I Current
R1 Voltage divider resistor While various embodiments of the invention have been described, it will be apparent to those of ordinary skill in the art that many more embodiments and implementations are possible within the scope of the invention. Accordingly, the invention is not to be restricted except in light of the attached claims and their equivalents.

The invention claimed is:

1. A resistor comprising:
   a) a first connecting part made of a conductor material;
   b) a second connecting part made of the conductor material;
   c) a resistor element made of a resistance material, wherein:

c1) the resistor element is arranged in the current direction between the first connecting part and the second connecting part and through which the electric current flows;
c2) the resistance material has a specific thermal force which generates a specific thermoelectric voltage at a temperature difference between the resistor element on the one hand and the connecting parts on the other hand, and
d) further comprising a compensating element which in operation generates a thermoelectric voltage which at least partially compensates the thermoelectric voltage generated by the resistor element
e) a first voltage tap which is electrically conductively connected to the first connecting part;
f) a second voltage tap which is electrically conductively connected to the second connecting part;
g) wherein a voltage measuring circuit can be connencted to the first voltage tap and to the second voltage tap in order to measure the voltage across the resistor element;
h) the second voltage tap is arranged on the first connecting part;
i) the second voltage tap is electrically insulated from the first connecting part;
j) the compensating element is thermally conductively connected to the first connecting part at the second voltage tap;
k) the second voltage tap is electrically conductively connected via the compensating element to a contact point on the second connecting part; and
l) the compensating element is electrically and thermally conductively connected to the second connecting part at the contact point on the second connecting part.

2. The resistor according to claim 1, wherein the compensating element is inserted into a voltage measuring line which measures the voltage drop across the resistor element.

3. The resistor according to 1, wherein:
a) the compensating element is thermally connected in parallel with the resistor element so that the compensating element is exposed to substantially the same temperature differences as the resistor element and therefore generates substantially the same amount of thermoelectric voltage as the resistor element; and
b) the compensating element is connected in series with the resistor element in the voltage measuring circuit so that the thermoelectric voltages of the resistor element and of the compensating element at least partially compensate each other.

4. The resistor according to claim 1, further comprising a voltage divider having two resistors, the voltage divider being connected in parallel with the compensating element and forming an external voltage tap with its central tap.

5. The resistor according to claim 1, wherein a printed circuit board, which carries the compensating element, is mounted on the resistor.

6. The resistor according to claim 5, wherein the printed circuit board is multi-layered.

7. The resistor according to claim 5, wherein the printed circuit board is soldered to the resistor.

8. The resistor to claim 1, wherein the compensating element is made of a material which has substantially the same thermal force as the resistance material with a deviation of less than 10%.

9. The resistor according to claim 1, wherein the compensating element also consists of the resistance material of the resistor element.

10. The resistor according to claim 1, wherein:
a) the connecting parts are each plate-shaped; and
b) the resistor element is plate-shaped.

11. The resistor according to claim 1, wherein:
a) the conductor material of the connecting parts is copper or a copper alloy or aluminum;
b) the resistance material is a copper-manganese alloy;
c) the resistance material of the resistor element has a higher specific electrical resistance than the conductor material of the connecting parts;
d) the resistance material of the resistor element has a resistive electrical resistance which is:
d1) less than $50 \cdot 10^{-7}$ $\Omega$m, and
d2) is greater than $1 \cdot 10^{-8}$ $\Omega$m; and
e) the resistor has a resistance value which is:
e1) at least 0.1 $\mu\Omega$, and
e2) a maximum of 1000 $\mu\Omega$; and
f) the resistor has a resistance value with a temperature coefficient of less than 500 ppm/K.

12. The resistor according to claim 1, wherein the two connecting parts and the resistor element are separated from a composite material strip transversely to the longitudinal direction of the composite material strip and bent.

13. A resistor comprising:
a) a first connecting part made of a conductor material;
b) a second connecting part made of the conductor material;
c) a resistor element made of a resistance material, wherein:
c1) the resistor element is arranged in the current direction between the first connecting part and the second connecting part and through which the electric current flows;
c2) the resistance material has a specific thermal force which generates a specific thermoelectric voltage at a temperature difference between the resistor element on the one hand and the connecting parts on the other hand;
d) further comprising a compensating element which in operation generates a thermoelectric voltage which at least partially compensates the thermoelectric voltage generated by the resistor element; and
wherein the compensating element is a composite material plate which consists externally of the conductor material of the connecting parts and centrally of the resistance material of the resistor element.

14. A resistor comprising:
a) a first connecting part made of a conductor material;
b) a second connecting part made of the conductor material;
c) a resistor element made of a resistance material, wherein:
c1) the resistor element is arranged in the current direction between the first connecting part and the second connecting part and through which the electric current flows;
c2) the resistance material has a specific thermal force which generates a specific thermoelectric voltage at a temperature difference between the resistor element on the one hand and the connecting parts on the other hand;
d) further comprising a compensating element which in operation generates a thermoelectric voltage which at least partially compensates the thermoelectric voltage generated by the resistor element; and wherein the compensating element comprises a part of the resistor element which is electrically insulated from the rest of the resistor element.

15. The resistor according to claim 14, wherein the compensating element also comprises a part of the first connecting part which is electrically insulated from the rest of the first connecting part.

16. The resistor according to claim 15, wherein the compensating element is electrically separated from the remainder of the first connecting part and of the resistor element by a separating slit.

17. The resistor according to claim 16, wherein the separating slit is introduced into the resistor by a laser beam or a water jet or by milling.

18. The resistor according to claim 17, wherein the separating slit is at least partially filled with a filling material.

19. The resistor according to claim 18, wherein the filling material is thermally conductive and electrically insulating.

20. A resistor comprising:
    a) a first connecting part made of a conductor material;
    b) a second connecting part made of the conductor material;
    c) a resistor element made of a resistance material, wherein:
        c1) the resistor element is arranged in the current direction between the first connecting part and the second connecting part and through which the electric current flows;
        c2) the resistance material has a specific thermal force which generates a specific thermoelectric voltage at a temperature difference between the resistor element on the one hand and the connecting parts on the other hand;
    d) a compensating element which in operation generates a thermoelectric voltage which at least partially compensates the thermoelectric voltage generated by the resistor element;
    wherein the compensating element has a reduced thickness with respect to the remainder of the resistor; and
    wherein the thickness reduction of the compensating element is produced by milling off the resistor in the region of the compensating element.

21. The resistor according to claim 20, wherein the thickness of the compensating element is less than 50% of the thickness of the remainder of the resistor.

* * * * *